(12) United States Patent
Heile

(10) Patent No.: US 6,367,058 B1
(45) Date of Patent: Apr. 2, 2002

(54) PARTITIONING USING HARDWARE

(75) Inventor: Francis B. Heile, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/276,482

(22) Filed: Mar. 25, 1999

Related U.S. Application Data
(60) Provisional application No. 60/079,582, filed on Mar. 26, 1998.

(51) Int. Cl.$^7$ ............................................. G06F 17/50
(52) U.S. Cl. ................................. 716/7; 716/2; 716/16
(58) Field of Search ............................... 716/7, 18, 16, 716/17, 1, 2

(56) References Cited

U.S. PATENT DOCUMENTS

| | | | | |
|---|---|---|---|---|
| 3,617,714 A | | 11/1971 | Kernighan et al. | ......... 235/150 |
| 5,140,526 A | * | 8/1992 | McDermith et al. | ........ 364/488 |
| 5,189,628 A | * | 2/1993 | Olsen et al. | ................ 364/489 |
| 5,659,717 A | * | 8/1997 | Tse et al. | .................... 395/500 |
| 5,892,681 A | * | 4/1999 | McDermith et al. | ........ 364/488 |
| 6,045,252 A | * | 4/2000 | Pedersen | .................... 364/489 |
| 6,080,204 A | * | 6/2000 | Mendel | .......................... 716/7 |

OTHER PUBLICATIONS

Clark, "Fitting Programmable Logic," IEEE Spectrum, Mar., pp36–39, 1992.*

Jozwiak et al., "Efficient Decomposition of Assigned Sequential Machines and Boolean Functions for PLD Implementations," IEEE, pp258–266, 1995.*

Linderman et al., "Design and Application of an Optimizing XROM Silicon Compiler", IEEE Trans on CAD, vol. 8, No. 12, Dec., pp1267–1275, 1989.*

Nourji et al., "Optimal VLSI Architecture for Distributed Arithmetic–Based Algorithms," IEEE, pp 509–512, 1994.*

* cited by examiner

*Primary Examiner*—Matthew Smith
*Assistant Examiner*—Leigh Marie Garbowski
(74) *Attorney, Agent, or Firm*—Beyer Weaver & Thomas, LLP; Dean E. Wolf, Esq.

(57) ABSTRACT

A disclosed method and mechanism provides for the use of hardware to perform the computations necessary for fitting an electronic design onto a substrate. This hardware design tool may be used in conjunction with a conventional software design tool which is reserved for performing other electronic design functions such as synthesis. In a disclosed example, the hardware tool performs the steps necessary to partition logic cells into logic blocks for use in a hierarchical electronic design. In this example, the hardware tool is provided as a product term device which temporarily stores information defining a given partitioning problem and then calculates the quality of the partition for every possible partition employing the constraints of the stored partitioning problem.

42 Claims, 11 Drawing Sheets

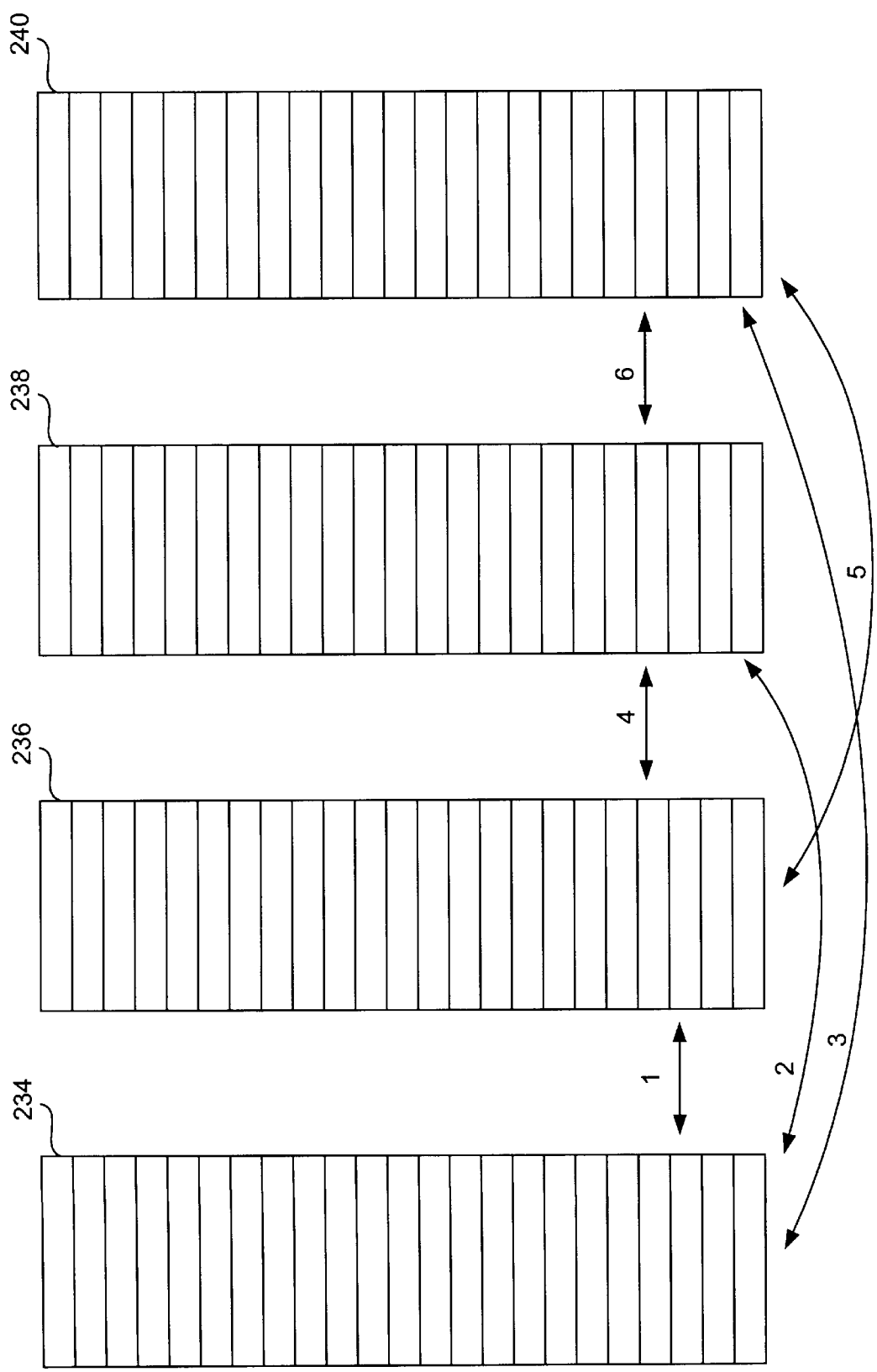

| STATE | 0 | 1 | 2 | 3 | 4 | 5 | 6 | 7 | 8 | 9 | 10 |
|---|---|---|---|---|---|---|---|---|---|---|---|
| ROM 1 NUMBER OF "1s" PER ENTRY | 0 | 1 | 2 | 3 | 4 | 5 | 6 | 7 | 8 | 9 | 10 |
| ROM 1 NUMBER OF ENTRIES | 1 | 10 | 45 | 120 | 210 | 252 | 210 | 120 | 45 | 10 | 1 |
| ROM 2 NUMBER OF "1s" PER ENTRY | 10 | 9 | 8 | 7 | 6 | 5 | 4 | 3 | 2 | 1 | 0 |
| ROM 2 NUMBER OF ENTRIES | 1 | 10 | 45 | 120 | 210 | 252 | 210 | 120 | 45 | 10 | 1 |

PARTITIONING USING HARDWARE

CROSS REFERENCE TO RELATED APPLICATION

This application claims priority of provisional U.S. patent application Ser. No. 60/079,582, filed Mar. 26, 1998, entitled "PARTITIONING USING HARDWARE" which is incorporated by reference.

BACKGROUND OF THE INVENTION

This invention relates to methods for fitting logic cells in an electronic design. More specifically, the invention relates to the use of hardware to perform the fitting function during design of an electronic product.

During the design phase of a new electronic product (e.g., an integrated circuit), logic functions must be designed, tested, and ultimately laid-out on a substrate (e.g., silicon or other semiconductor). The layout component of this process typically involves placement of logic blocks at specified locations on the substrate and routing lines between the various logic blocks on the substrate. These functions are generically referred to as "place and route."

In some electronic products—notably some programmable logic devices—the layout of logic on the substrate assumes a hierarchy. In this hierarchy, fundamental units of logic may be referred to as logic cells or logic elements. These logic cells may be grouped into larger blocks of logic that may be referred to as "logic array blocks" for example. These blocks of logic may, in turn, be grouped into rows and ultimately columns on the hardware device.

In such "hierarchical" electronic designs, the place and route design function may be supplemented by a "partitioning" function in which lower level logic elements (e.g., logic cells) are grouped into larger logic blocks (e.g., logic array blocks). It is these logic blocks that are then placed on the substrate in a manner analogous to a conventional placement operation in place and route. Lines between the logic blocks are then routed in a conventional routing fashion. Collectively, partitioning and place and route are referred to as "fitting" operations.

Modem tools for designing electronic products are implemented as software. This software may allow the designer to specify the desired functioning of the end device, as well as some architectural and logic constraints. The software tools can take this information and, with the designer's aid, develop Boolean, schematic, and ultimately hardware designs. In the design process, the software fits the logic onto the hardware device to provide the final design layout.

Typically the design software "compiles" a design to produce a hardware layout. Compilation takes as an input a user's specifications (including high and low level logic constraints, timing requirements, etc.) and then synthesizes that design and fits it onto a target hardware device. In the case of programmable devices, the resulting compiled electronic design is then used to program a blank (unprogrammed) device. Designs for application specific integrated circuits, including programmable logic devices and field programmable gate arrays, as well as non-programmable electronic devices such as gate arrays all may require compilation involving synthesis of logic functions and fitting.

Commonly the fitting operations occupy the vast majority of the compile time. For example, in some programmable logic devices, the partitioning operation can occupy as much as four-fifths of the time to compile a design. This is true even when the compiler uses "fast" algorithms which do not try each and every possible partition before settling on a "best" partition. Such algorithms often do find the truly best partition from among all possible partitions. However, there are also numerous instances when they converge on a less than optimal partition.

As electronic designs including programmable gate arrays, etc. become larger and more complex, the time required for software tools to compile and perform other design operations is growing rapidly. In fact, compile times increase quadratically with the number of logic gates in a design. For this reason, it is desirable to find methods and mechanisms for increasing the speed at which design tools perform their functions, such as compilation. It would be particularly desirable to find a way to increase the speed at which these tools perform the most computationally expensive tasks such as fitting.

SUMMARY OF THE INVENTION

The present invention provides a method and mechanism for speeding the fitting portion of electronic design compilation. Specifically, the invention provides for the use of hardware to perform the computations necessary for fitting an electronic design onto a substrate. This hardware may be used in conjunction with a conventional software design tool which is reserved for performing other design functions such as logic synthesis and technology mapping. In a preferred embodiment, the hardware tool performs the steps necessary to partition logic cells into logic blocks for use in a hierarchical electronic design. In a particularly preferred embodiment, the hardware tool is provided as a product term device which temporarily stores information defining a given partitioning problem and then calculates the quality of the partition for every possible partition employing the constraints of the stored partitioning problem.

One aspect of the invention provides a method of compiling an electronic design. The method may be characterized as performing calculations necessary for fitting on hardware designed or programmed for performing the calculation. Preferably, the hardware includes a plurality of product terms, arranged in an array on a programmable logic device for example. The product terms may be provided on an appropriate configured embedded array block of the programmable logic device.

When product terms are employed, they may store a representation" of the connections to logic cells via appropriately programmed memory elements on intersection of bitlines and wordlines of the product terms. From this arrangement, the system determines the "metric" of various fitting options for logic elements by controlling values on wordlines to the product terms. This allows the system to determine the best fitting option. This approach is particularly well adapted for determining the best of several the partitions of the logic cells into two or more logic blocks. When the hardware performs partitioning, the each of the wordline or pair of wordlines to the product terms represents a cell that is to be provided in one of two logic blocks. Each product term or pair of product terms represents a signal that is fed to one or more of the cells. Each set of inputs to the wordlines corresponds to a different partition. Multiple partitions of the logic cells to the logic blocks are compared by varying the wordline inputs and measuring the product term outputs. The outputs represent the number of interconnections that must be made to the logic block under consideration (as defined by input values on the wordlines). In some embodiments, determining which partition provides the best fit involves determining which partition has the lowest total number of connections to the logic block. In other embodiments, it involves a further consideration of a balance of connections between the logic blocks of the partitions.

Another aspect of this invention is the hardware device that performs the fitting operation. Such hardware may be characterized as a first product term array configured to (a) provide a representation of connections to a plurality of logic cells and (b) output the number of connections to a first logic block containing a first subset of the plurality of logic cells. The number of connections is determined by a first set of input values to the first product term array which first set of input values represent the first subset of logic cells in the first logic block. As noted, the input values to the product term array may be provided through wordlines to the product term array.

To generate the input values to these wordlines, the hardware device may employ a generation block which defines a plurality of patterns of input values to the product term array, with each pattern specifying a partition of the logic cells into the logic blocks. Preferably, the generation block includes a ROM storing multiple values, each corresponding to a partition of the logic cells into the logic blocks. In a specific embodiment, the generation block contains two ROMs each of which stores values containing a number of bits equal to one-half the number of logic cells in the plurality of logic cells. To count the number of interconnections output by the product term array, the hardware may employ an adder block (e.g., a series of adders or a tree of adders) coupled to the product term array, which counts the number of connections output by the product term array.

In a preferred embodiment, the hardware includes a second product term array in addition to the first product term array. The second product term array is configured to (a) provide the representation of connections to the plurality of logic cells (same as in the first product term array) and (b) output the number of connections to a second logic block containing a second subset of the plurality of logic cells. Usually, the second subset of cells will be those cells which were not present in the first subset. In this case, a second set of input values is provided to the second product term, which second set of input values is the compliment of the first set of input values. To quickly calculate the total number of interconnections to each of the logic blocks in a partition, each of the first and second product term arrays may have their outputs coupled to adder blocks, which count the numbers of connections output by the product term arrays. The outputs of these adder blocks may be provided to a summing unit which sums the number of connections output by the adder blocks to provide a total number of connections to the first and second logic blocks. Finally, the hardware may include a storage unit which stores information about the best of a plurality of partitions of the logic cells between the first and second logic blocks.

These and other features and advantages of the present invention will be further described in the following description of the invention in conjunction with the associated figures.

BRIEF DESCRIPTION OF THE DRAWINGS

FIG. 2B is a block diagram depicting the sequential pairing of logic blocks during the partitioning process depicted in FIG. 2A.

FIG. 4A is a representation of a ROM state circuit used to generate all possible partitions of a logic block pair.

DETAILED DESCRIPTION OF THE PREFERRED EMBODIMENTS

The inventor has recognized that a considerable decrease in design compile time can be realized by employing specially designed hardware to perform at least some fitting functions during electronic design compilation. Preferably, the hardware will perform some computationally intensive tasks, while software will perform more complex tasks that require fewer redundant computations. In other words, the specially designed hardware may be employed at processing bottlenecks, i.e., those processing steps that require proportionately greater time to execute. As mentioned above, one such bottleneck is the compilation steps required to "partition" a design onto a semiconductor substrate.

To illustrate the invention, a partitioning problem will be discussed below. The word "partition" may refer to a specific division of logic cells between two logic blocks of defined size. As mentioned, partitioning is a particularly computation intensive task in compiling a programmable logic device design. The specially designed hardware employed to perform the partitioning function will be a product term array in the description below. It should be understood that the invention is neither limited to partitioning problems, nor to the use of product term arrays to perform computations. This partition problem and the product term hardware are described simply to facilitate understanding of the invention. Other fitting problems could profit from the use of specially designed hardware. And other hardware designs could be employed to expedite processing of particular design and compilation problems.

1. EXAMPLE OF A HIERARCHICAL ASIC DESIGN

Figure 1:
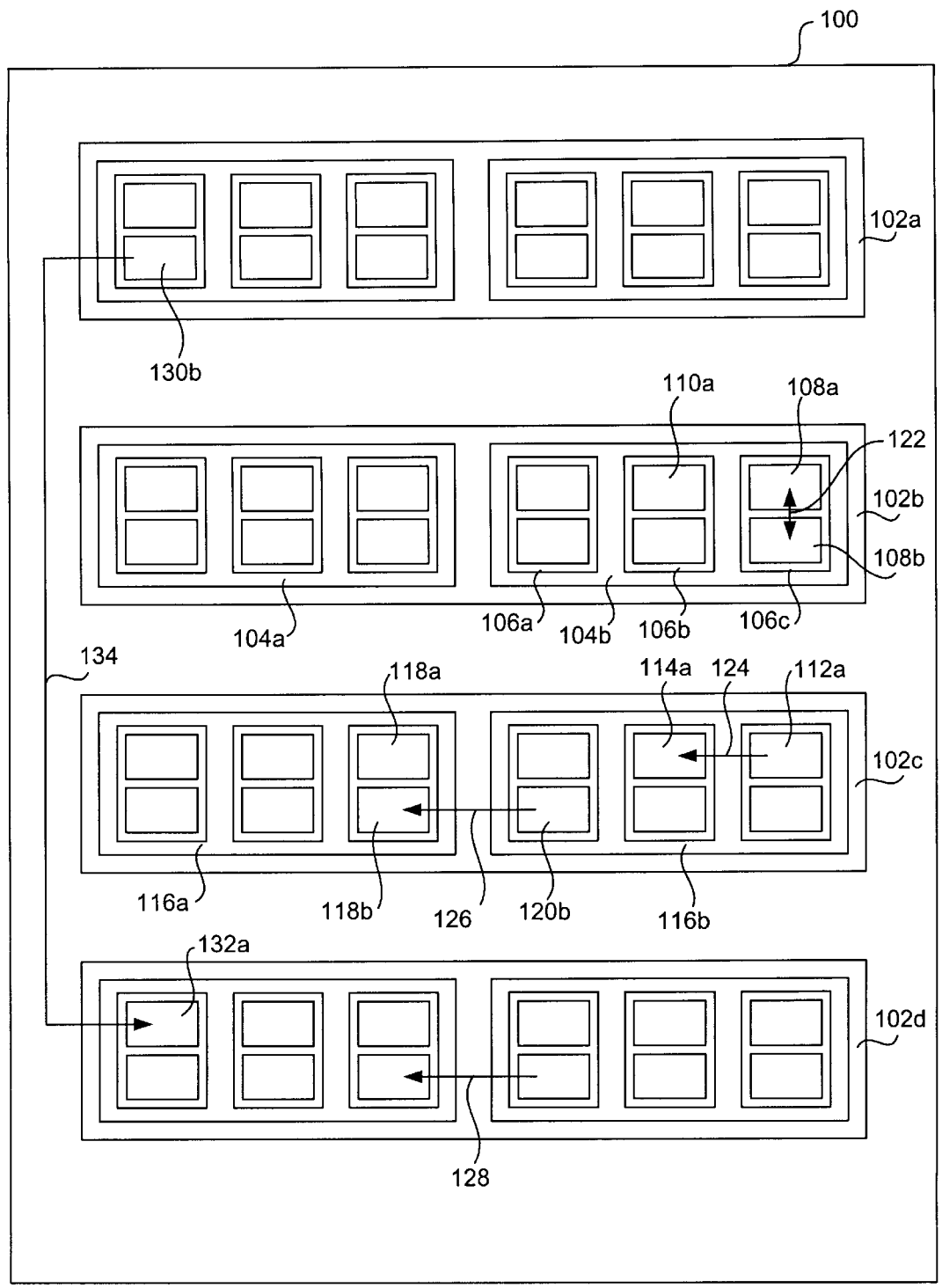
FIG. 1 is an simplified block representation of the architecture of one type of hierarchical programmable logic device, including interconnects.

The partitioning problem associated with an exemplary "hierarchical" programmable logic device architecture will now be described. A hypothetical target hardware device having multiple hierarchical containment levels is represented in FIG. 1. This idealized representation roughly conforms to the layout of a FLEX 10K programmable logic device available from Altera Corporation of San Jose, Calif. In FIG. 1, a programmable logic device 100 is segmented into a plurality of "rows" to facilitate interconnection between logic elements on a given row. In the hypothetical example shown, there are four rows: 102a, 102b, 102c, and 102d.

Each row of programmable logic device 100 is further subdivided into two "half-rows." For example, row 102b is shown to contain a half-row 104a and a half-row 104b. The next lower level of the containment hierarchy is the "logic array block" (LAB). Half-row 104b, for example, contains three LABs: a LAB 106a, a LAB 106b, and a LAB 106c. Finally, at the base (or leaf level) of the containment hierarchy are several "logic elements." Each such logic element exists within a single logic array block. For example, LAB 106c includes two logic elements: a logic element 108a and a logic element 108b.

In short, PLD 100 includes four levels of hierarchical containment: (1) rows, (2) half-rows, (3) LABs, and (4) logic elements. Any logic element within PLD 100 can be uniquely specified (and located) by specifying a value for each of these four levels of the containment hierarchy. For example, logic element 108b can be specified as follows: row (2), half-row (2), LAB (3), LE (2).

To fit a logic design onto a target hardware device such as that shown in FIG. 1, a synthesized netlist is divided into logic cells (typically containing one or more gates) which are placed in the various logic elements as uniquely defined above. Thus, each logic cell from the synthesized netlist resides in a unique single logic element.

Grouping logic cells into LABs for the purpose of reducing connections to and/or form the LABs is an example of partitioning. After the partitioning operation is complete, the various LABs of the design are placed at specific locations on the programmable logic device 100. Note that the full complement of logic cells is said to be "partitioned" into the various LABs A multi-level containment hierarchy such as that shown in PLD 100 may include multiple levels of routing lines (interconnects). These connect the uniquely placed logic cells to one another to form complete circuits. In PLD 100, for example, four levels of interconnect are provided, one for each of the four containment hierarchy levels. First a local interconnect such as interconnect 122 is employed to connect two logic elements within the same LAB. These are the fastest interconnects. At the next level, a LAB-to-LAB interconnect such as interconnect 124 is employed to connect two LABs within the same half-row. At the next higher level, a "global horizontal" interconnect is employed to connect logic elements lying in the same row but in different half-rows. An example of a global horizontal interconnect is interconnect 126 shown in row 102c. Another global horizontal interconnect is shown as interconnect 128, linking logic elements within row 102d. Finally, a "global vertical" interconnect is employed to link a logic element in one row with a logic element in a different row. For example, a global vertical interconnect 134 connects a logic element 130b in the first LAB of the first half-row of row 102a to a logic element 132a in row 102d. Consistent with the architecture of Altera Corporation's FLEX 10K CPLD, global vertical interconnects are directly coupled to the logic element transmitting a signal and indirectly coupled (through a global horizontal interconnect) to the logic elements receiving the transmitted signal.

In a target hardware device, there will be many paths available for routing a given signal line. To the extent possible, signals should be transmitted via local interconnects. This is the fastest way to get a signal from one logic element to another and it is the goal of partitioning.

The interconnect structure and overall architecture of the Altera FLEX 10K family of PLDs is described in much greater detail in U.S. Pat. No. 5,550,782, issued on Aug. 27, 1996, naming Cliff et al. as inventors, and entitled "PROGRAMMABLE LOGIC ARRAY INTEGRATED CIRCUITS." That application is incorporated herein by reference for all purposes. Additional discussion of the FLEX 10K and other PLD products may be found in the Altera 1998 Data Book available from Altera Corporation of San Jose, Calif. The Data Book is incorporated herein by reference for all purposes.

Briefly, in the FLEX 10K architecture, there are at least three rows, with two half-rows per row, and at least twelve LABs per half-row. Each LAB includes eight logic elements each of which, in turn, includes a 4-input look-up table, a programmable flipflop, and dedicated signal paths for carry and cascade functions. The eight logic elements in an LAB can be used to create medium-sized blocks of logic—such as 8-bit counters, address decoders, or state machines—or combined across LABs to create larger logic blocks.

It should be understood that the present invention is not limited to the Altera FLEX 10K architecture or any other hardware architecture for that matter. In fact, it is not even limited to programmable logic devices. It may be employed generically in target hardware devices as broadly defined above and preferably in application specific integrated circuit designs. PLDs are just one example of the ICs that can benefit from application of the present invention.

A fundamental goal of the partitioning problem for this architecture is to group logic cells into logic array blocks such that a minimal number of inputs are required to the logic array block. Thus, the logic cells grouped in a logic block should, to the extent possible, have one or more direct connections among themselves.

2. EXAMPLE OF PARTITIONING IN AN ASIC

In a preferred embodiment, the hardware preferably should determine whether a given signal under consideration has both an input and an output in the same partition. In other words, does one cell of the partition output the signal while another cell of the same partition inputs the same signal? If so, then there is no input or output of that signal to the partition. This is a desirable situation as it reduces the amount of interconnection required to the logic block containing the cells. A similar situation exists when the signal under consideration is neither input to nor output from the cells of the logic block under consideration. As used herein, the term "matched input signal" refers to logic blocks containing one cell that sources the signal and all cells that are fed by the signal.

Figure 2A:
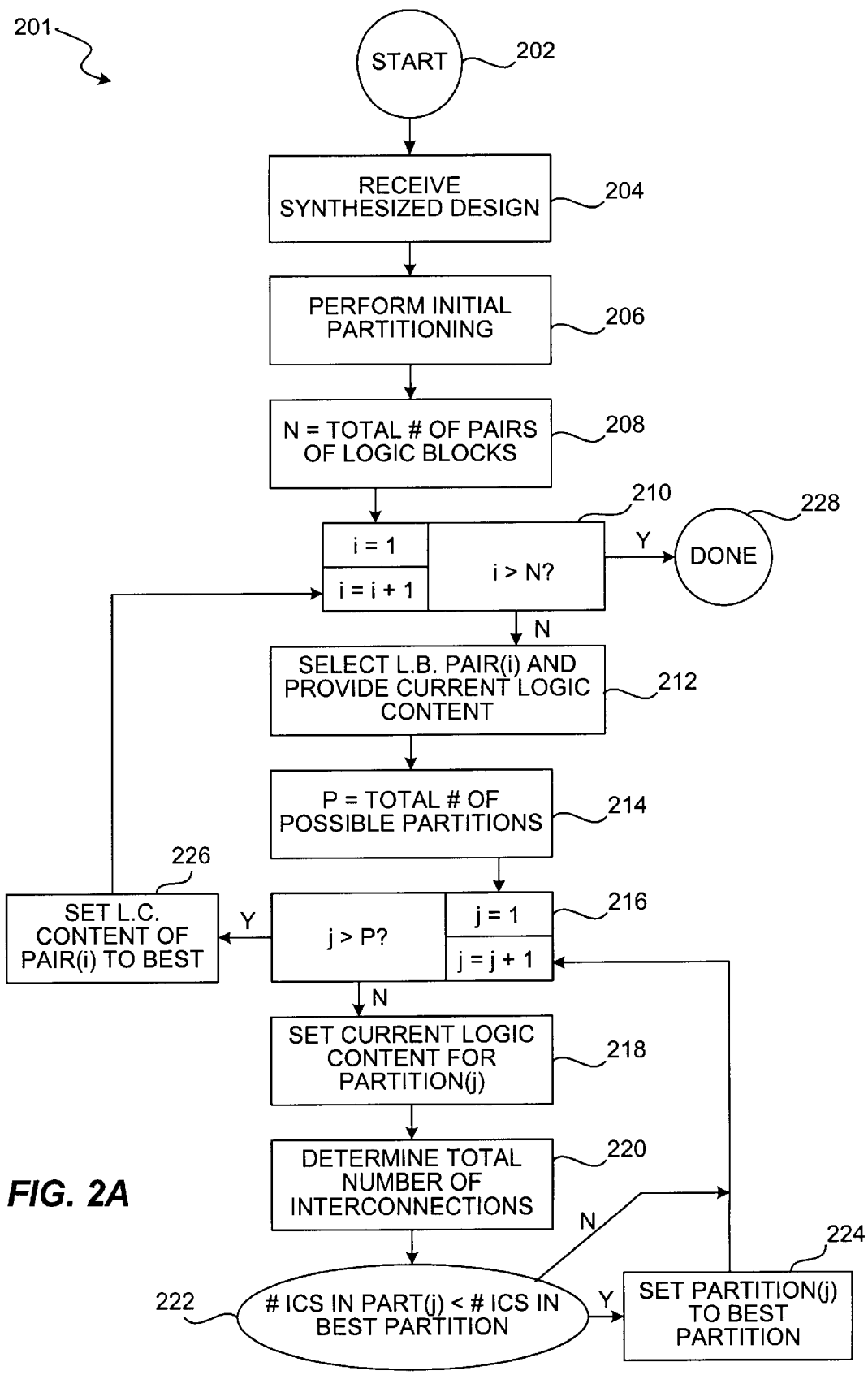
FIG. 2A is a process flow chart depicting one technique for obtaining an optimal partitioning of logic cells among a plurality of logic blocks in accordance with one embodiment of this invention.

FIG. 2A illustrates one possible process flow employing a hardware partitioning device in accordance with this invention. As shown, a partitioning process 201 begins at 202 and at a process step 204, the system receives a synthesized design containing a plurality of logic cells and associated input and output signals from those cells. Then, at a process step 206, the system performs an initial partitioning of all the logic cells in the design such that those logic cells are grouped into various logic blocks. The collection of logic cells within a logic block is referred to as that block's "current logic cell content." Various techniques may be employed to perform this initial partitioning, but often it will be suitable to employ an essentially random grouping.

At this point, the partitioning process begins looping through various pairs of logic blocks to home in on an optimal partition. To accomplish this, the system considers all possible pairings of the various logic blocks populated in step 206. The looping process may employ a value "N" which specifies the number of possible pairs of logic blocks as indicated at a process step 208. Next, an iterative loop step 210 controls the incrementing of a counter i keeping track of the logic block pairs. Initially, the value of the counter "i" is set to 1. Then, loop step 210 compares the current value of i against the value of N. Assuming that the value of i is less than or equal to the value of N, process control is directed to a step 212 where the system selects the next available pair of logic blocks as specified by the current value of the counter i. This logic block pair(i) is subsequently processed to determine an optimal partition (deemed "best partition") of the logic cells that they contain. No outside logic cells are considered. To begin this process, the logic cells within a logic block of the pair are deemed the logic block's "current logic content." In the first iteration involving a given logic block, its current logic content will be set by step 206 and may be essentially random. In later iterations employing that logic block, the current logic content will have been defined by the previous processing.

Within an iteration i, the system identifies a most efficient partitioning of cells between the two logic blocks. It accomplishes this by swapping cells between the logic blocks until the number of external interconnections feeding signals to the logic blocks is minimized. Thus, the system must keep track of the number of such external interconnections for each arrangement of cells between the two logic blocks.

To arrive at the optimal partitioning, the system preferably considers each possible partition of the logic cells between the two current logic blocks using a hardware device to speed the process. Assuming that all possible partitions are considered, the system may initially set a variable P, as indicated at a step 214, to a value equaling the total number of possible partitions. For example, if there are two logic blocks of 10 cells each (20 cells total), there are 184,756 possible partitions. Thus, in this case the value of P is 184,756. At this point, the value of "best partition" may be set to infinity—so that the initial partition considered is deemed "best partition" at least temporarily.

To control iterations through the various partitions to be considered, an iterative loop step 216 increments a counter "j" between 1 and P. On the first pass, j=1, the partitioning includes the current logic cell content as specified at step 212. Assuming that the value of j is less than or equal to the value of P, the system sets the partition of logic cells between the two logic blocks to the arrangement associated with the current value of j. When j=1, the partition corresponds to the current logic cell content which was previously set. See step 218. After that, the system determines the total number of interconnections (or the total number of inputs or outputs) to the two logic blocks currently considered using the current partitioning. See step 220. Preferably, this step is implemented with a hardware device such as that described below. Next, at a decision step 222, the system determines whether the number of interconnections determined at step 220 in the current partition (partition (j)) is less than the number of interconnections in the "best partition."

Assuming that the system determines at step 222 that the number of interconnections to partition (j) is less than a number of interconnections in the "best partition," process control is directed to a step 224 where the system sets partition (j) to the best partition. At that point, the system also saves the number of interconnections associated with partition j. Thereafter, process control is directed back to iterative loop step 216 where the value of j is incremented by 1 as shown. Note that if decision step 222 is answered in the negative, process control is also directed back to decision step 216, but without resetting the "best partition."

The system continues to loop through steps 216, 218, 220, 222, and where necessary, step 224 until all possible partitions have been evaluated by the hardware. At this point, a truly "best partition" is known. Also at this point, iterative loop step 216 determines that the current value of the counter j is for the first time greater than the value of P. This causes process control to be directed to a step 226 which sets the logic cell content of the two current logic blocks to the "best partition." This means that going forward, when either of those logic blocks is employed in a subsequent pairing (as chosen at step 212), the initial logic content employed will be that identified in the previous looping under the control of step 216.

After performing step 226, the system directs process control back to iterative loop step 210 where the counter i is incremented by one. Assuming that the value of i remains less than or equal to the value of N, process control returns to step 212 where the systems sets a new combination of current logic blocks and initializes their current logic content. Next, as said before, the system sets the value of the best partition to infinity and sets the value of the variable P to the total number of partitions of the two cells under consideration. In most cases, the value of P will remain unchanged throughout all values of i.

Thereafter, the partitioning is optimized by considering all possible partitions and identifying the "best partition" as described above. This process of selecting new groups of two logic blocks and then determining the best partition of cells between those two logic blocks continues under the control of iterative loop step 210 until all possible pairings of logic blocks have been considered. At that point, the value of the counter i is for the first time greater than the value of N. The process is then concluded at 228 with the current logic content of each logic block defining an optimal partitioning.

The consideration of all possible pairs of logic blocks is illustrated in FIG. 2B for a simple case involving only four logic blocks. As shown, in this example, there are six pairings of the logic blocks that must be considered. In one example, a first pairing involves logic blocks 234 and 236. A second pairing involves logic blocks 234 and 238. A third pairing involves logic blocks 234 and 240. Additional pairings are shown.

The use of hardware to perform the calculations necessary to identify the best partition of logic cells between the two logic blocks currently under consideration (involving at least step 220 and possibly step 222) can greatly speed the process of identifying the optimal partitioning. Further, it can guarantee that the best possible partition will be found. This is because it considers each and every partition of cells between each pair of logic blocks that it considers. Most current partitioning software considers only a limited subset of the total possible partitions. One widely used algorithm is the Kerningham and Lin algorithm described in U.S. Pat. No. 3,617,714 and in B. W. Kerningham and S. Lin, "An Efficient Heuristic Procedure for Partitioning Graphs" Bell Systems Technical Journal, February 1970 which are incorporated herein by reference for all purposes. In the case of two logic blocks employing ten logic cells each, the Kerningham and Lin algorithm may consider only twenty to two hundred of the possible partitions. As noted, there may be nearly 185,000 possible partitions. Quite impressively, the Kerningham and Lin algorithm finds the optimal partition in 80–90% of the cases. Nevertheless, it does not guarantee that the best partition has in fact been found. Thus, the hardware solution of this invention may not only represent a speed advantage, but will also do a better job of finding the optimal partition. As mentioned, when all possible partitions are considered, the optimal partition is guaranteed to be found.

3. EXAMPLE OF PTERM HARDWARE USED TO PARTITION AN ASIC

A desirable hardware design for performing the partitioning operation will be easily configurable to provide a representation of the connections to the various logic cells that are to be used in a particular partitioning problem. It should also be able to rapidly calculate the number of inputs required for a logic block in a particular partitioning employing the logic cells under consideration. In this manner, many or all of the various possible partitions of the selected logic cells between two logic blocks can be evaluated rapidly. In fact, because hardware is so much faster than software, all possible combinations of logic cell partitions between two logic blocks can be rapidly tried.

Programmable logic allows "representations" of logic cell connections to be reprogrammed. This allows multiple partitioning problems to be performed sequentially or in parallel if the hardware device is sufficiently large. To illustrate this invention, a programmable product term array will be employed to solve the partitioning problem. Note that programmable product term arrays may sometimes be configured to implement Content Addressable Memory ("CAMs"). In fact, a CAM may be implemented together with a partitioning unit of this invention.

Product term devices are programmable logic devices which are well understood and described in various places including the 1998 Altera Data Book which was previously incorporated by reference. In short, product term devices are formed in arrays including multiple wordlines and bitlines. The wordlines typically come in pairs, with one member of the pair specifying an input value and the other member of the pair specifying its compliment. At the intersection of any pair of such wordlines with a bitline, one or no members of the pair are "programmed." When the intersection is programmed, a programmable bit is set to control the potential on the bitline when the wordline is high. The programmable bit is usually a memory element such as an EPROM, an EEPROM, a flash element, or an SRAM.

The bitlines in product term devices may be viewed as very large inverted input AND gates which have as their inputs the various wordlines which are programmed to be connected to it. Only when all the connected wordlines have low values is the output of the bitline high (assuming positive logic). Typically in product term devices, two or more of the bitlines are connected by an OR gate or a NOR gate. Each bitline is conventionally referred to as a "product term" or simply a "Pterm."

Figure 3A:
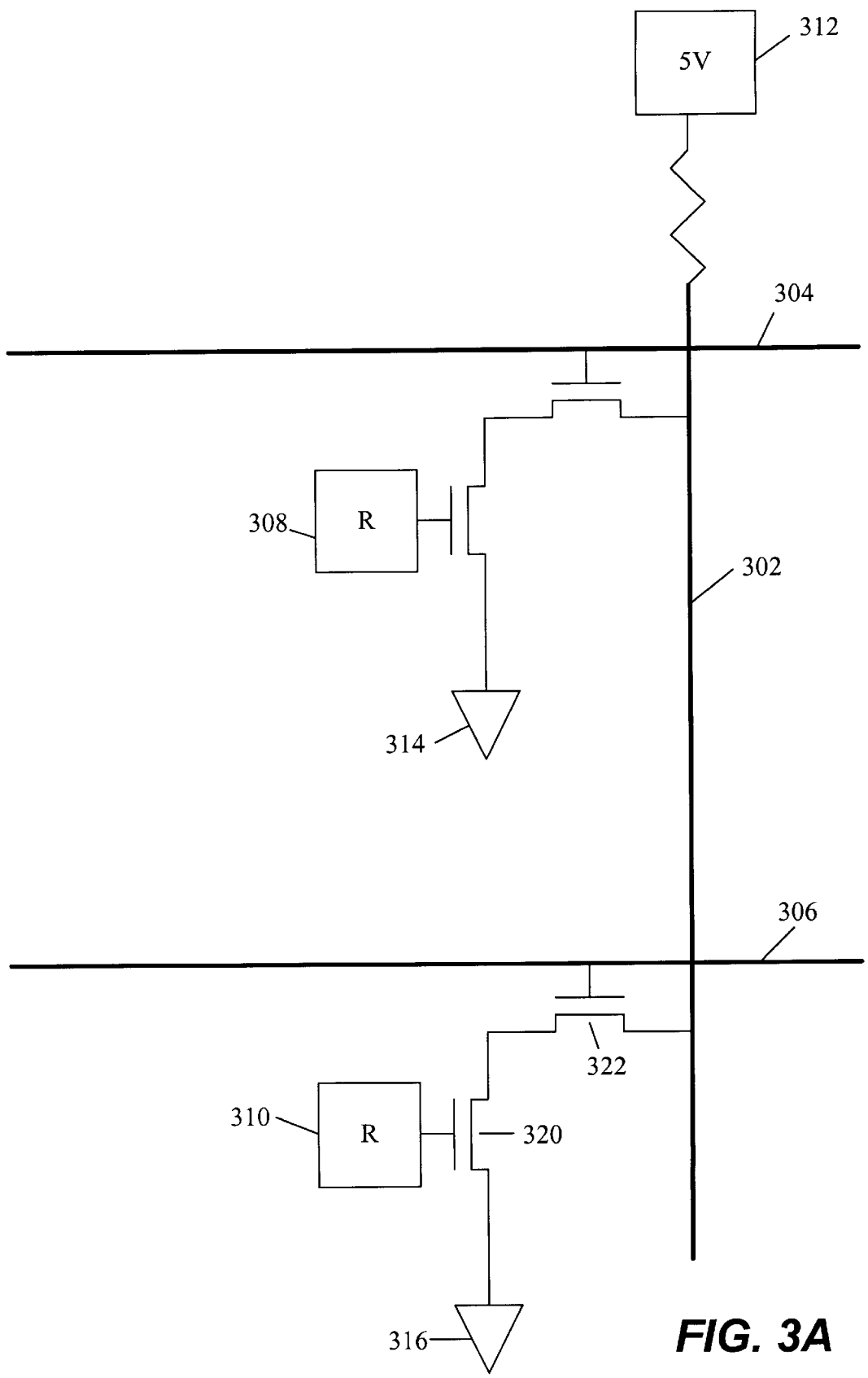
FIG. 3A is a schematic illustration of a product term and associated programmable memory elements.

An example of a product term is depicted in FIG. 3A. As shown there, a product term bitline 302 includes two wordlines 304 and 306. At the intersection of each wordline with bitline 302, there is a programmable bit (illustrated as 308 for wordline 304 and as 310 for wordline 306). Without programming, bitline 302 is held at a "high" value by a weak pull up 312. However, the bitline can be pulled down by a ground contact 314 or a ground contact 316—but only if corresponding bit is programmed and the corresponding wordline is high. This can be understood with reference to wordline 306 as follows. Ground 316 is connected to bitline 302 through two NMOS transistors 320 and 322. Transistor 320 is controlled by programmable bit 310. When programmable bit 310 is programmed, transistor 320 is on. Transistor 322 is controlled by wordline 306. When wordline 306 is high, transistor 322 is on. Only when both programmable bit 310 is set and wordline 306 is high, can ground 316 influence the potential on bitline 302. When this occurs, the potential on bitline 302 goes low. In fact, when any programmed bit is set and the corresponding wordline is high, the entire pterm bitline goes low.

Figure 3B:
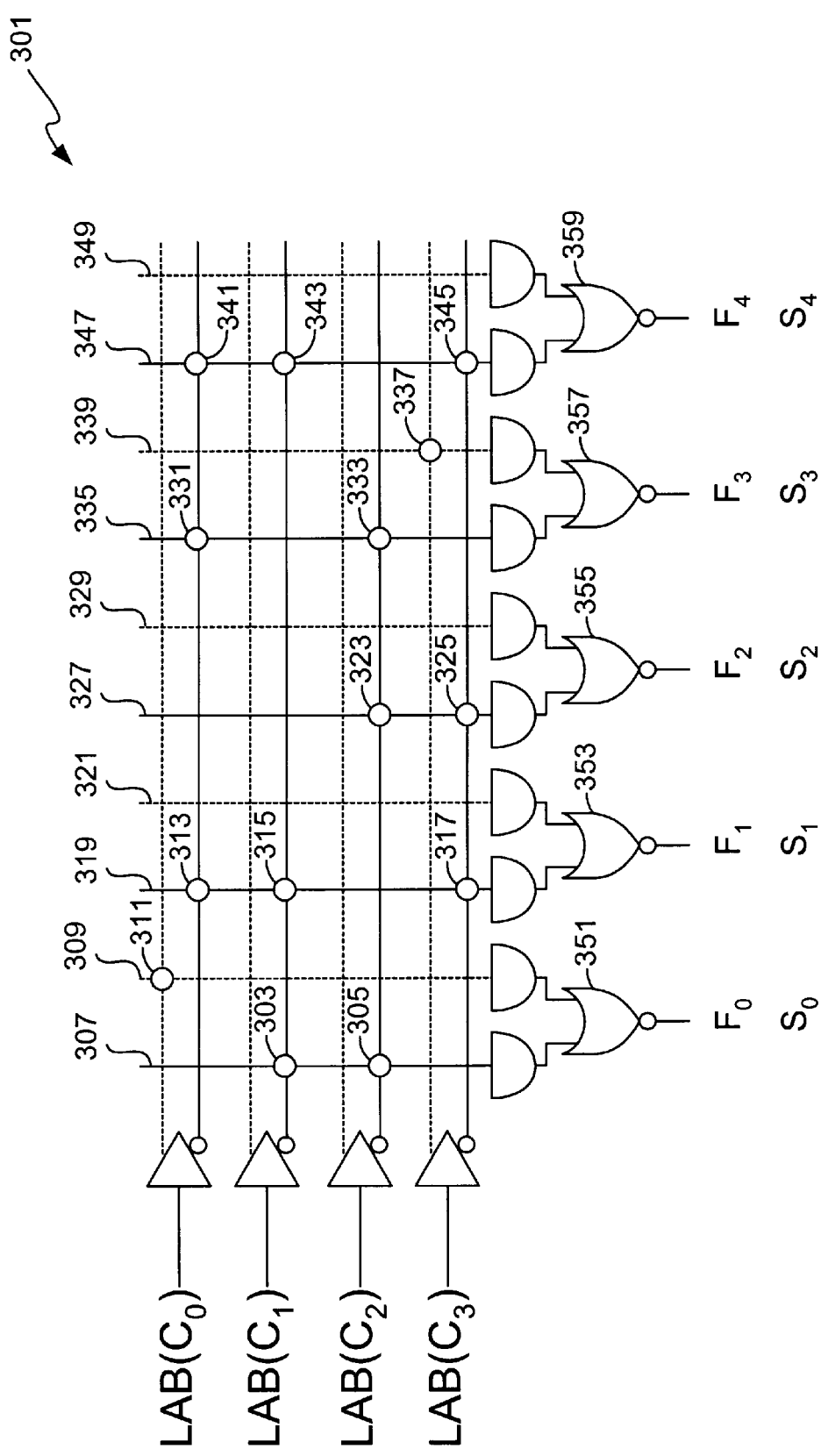
FIG. 3B is a schematic illustration of a product term array programmed to represent the interconnection matrix of a plurality of logic cells and to determine the number of input lines to logic blocks having various partitions of the logic cells.

An example of the use of a product term array to implement the present invention is presented in FIG. 3B. This example illustrates how a product term array can be programmed to represent the interconnection matrix of four logic cells that are partitioned between two logic blocks of two cells each. As will be illustrated more fully below, each pair of wordlines represents a single logic cell and each pair of bitlines (connected to a common NOR gate) represents a single signal (which may be fed to or output from any given logic cell). In this example, assume that there are four cells are denoted C0, C1, C2, and C3. Also assume that the four cells are fed by five signals: S0, S1, S2, S3, and S4. In this example, further assume that signals S1, S3, and S4 all feed cell C0. Assume that signals S0, S1, and S4 all feed cell C1. Further, assume that signals S0, S2, and S3 all feed cell C2. Finally, assume that signals S1, S2, and S4 all feed cell C3.

Regarding cell outputs, assume that signal S0 is the output of cell C0. Further assume that signal S3 is the output of cell C3. Together, this combination of signal outputs and inputs defines the "interconnection matrix" of the four cells that are partitioned between two logic blocks.

To program the product term array with this interconnection matrix, memory elements are set to represent the inputs and outputs of the various cells to be partitioned. For each signal, one product term (bitline) is programmed with the cells that are fed by that signal. For that same signal, another bitline is programmed with the cells that output that signal. The interconnections are "programmed" on the bitlines by setting the memory element at the intersection of the appropriate wordline associated with the cell and the product term for the signal output or input.

In a product term array 301 illustrated in FIG. 3B, the top pair of wordlines (represented as horizontal lines) is fed by a signal corresponding to cell C0. The second, third, and fourth pairs of wordlines are fed by signals representing cells C1, C2, and C3, respectively. The input to the wordlines will be set false when the corresponding cell is in the logic block being considered. The left most pair of product terms (vertical bitlines) represent signal S0. The second, third, fourth, and fifth pairs of product terms represent signals S1, S2, S3, and S4, respectively.

Now consider signal S0. As indicated above, it feeds cells C1 and C2. This is represented by programming a memory element 303 at the intersection of the cell C1 wordlines and signal S0 input product term. It is similarly represented by programming a memory element 305 at the intersection of the cell C2 wordlines and signal S0 input product term. Note that each pair of wordlines associated with a given cell contains one wordline that provides the value associated with that cell and another wordline that provides the compliment of that value. Either of these wordlines can be programmed with the appropriate memory elements. In this example, input signals are represented by programming the memory elements at the intersection of the appropriate product term bitline and the compliment wordline associated with the cell under consideration. Output signals are represented by programming memory elements on the true word line.

Also notice that in this example the product terms associated with the interconnections in which a signal is input to cells are represented by solid vertical lines. Interconnections in which the signals are output by the cells are represented by dashed vertical lines. Thus, programmed elements 303 (representing the input of signal S0 to cell C1) and 305 (representing the input of signal S0 to cell C2) are provided on an input product term 307 for signal S0.

As mentioned, signal S0 is output by cell C0. A product term 309 represents signal S0 acting as an output. A programmed memory element 311 on product term 309 represents the output of signal S0 at cell C0. As mentioned, memory elements representing the outputs of cells are programmed not on a cell's compliment wordline but on its true wordline. Thus, in representing the interconnection matrix of a collection of cells and signals to be partitioned, the signal inputs are represented by programmed memory elements at the interconnection of compliment wordlines and "input" product terms. In contrast, output signals are represented by programmed memory elements at the intersections of "true" wordlines and "output" product terms. In general, either the inputs or outputs could be programmed on the true wordlines. However, if inputs are programmed on the true wordline, outputs should be programmed on the compliment wordline.

As noted, cells C0, C1, and C3 all receive signal S1 as an input. These inputs are represented as programmed memory elements 313, 315, and 317 on a product term 319. None of the four cells under consideration output signal S1. Therefore, product term bitline 321 is shown without programmed memory elements. Regarding signal S2, no cells output this signal, but it is input to cells C2 and C3. Thus, memory elements 323 and 325 are programmed on input product term 327. No programmed memory elements are shown on output product term 329. Regarding signal S3, it is input to cell C0 and C2. Therefore, memory elements 331 and 333 are programmed on input product term 335. Signal S3 is output by cell C3. Therefore, memory element 337 is programmed on output product term 339. Finally, regarding signal S4, it is input to cell C0, C1, and C3. Because of this, memory elements 341, 343, and 345 are programmed on input product term 347. Signal S4 is not output by any of the cells under consideration. Therefore, no memory elements on output product term 349 are shown to be programmed.

Initially, assume a partition in which cells C0 and C1 reside in the logic block under consideration. This is the first logic block that will be considered. It is designated in product term array 301 by setting the input values for LAB C0 and LAB C1 to false. The goal at this point is to determine the total number of interconnections required to feed both of the logic blocks in the partition. The process will take two steps. First, the number of input interconnections to the logic block comprising cells C0 and C1 will be determined. Then, the number of input interconnects to the logic block comprising cells C2 and C3 will be determined. The sum total input interconnections to the two logic blocks will be the "metric" of the partition. This value of "metric" can be compared with that of other partitions.

Interconnection values are output at NOR gates connecting the input and output product terms for each signal. A NOR gate 351 is provided for signal S0, a NOR gate 353 is provided for signal S1, a NOR gate 355 is provided for signal S2, a NOR gate 357 is provided for signal S3, and a NOR gate 359 is provided for signal S4.

Considering now signal S0, the input line 307 includes programmed memory elements 303 and 305 corresponding to cells C1 and C2. Because cells C0 and C1 reside in the logic block under consideration, the inputs to their corresponding wordlines are "false." Because the cells C2 and C3 do not exist in this logic block, the inputs to their corresponding wordlines are set as "true." Assuming that the potential associated with "true" is 5V and the potential associated with "false" is 0V, the "false" wordlines for cells C0 and C1 are set at 5V in this example. The compliment wordlines for both of these cells is set at 0V for this example.

No memory element is programmed on the input product term 307 intersection with the wordlines for C0. Therefore, the "LAB C0 input" has no influence on product term 307 (for signal S0). Because memory element 303 is programmed on the compliment wordline for cell C1 and the "LAB C1 input" for that wordline is 5V, the potential on bitline 307 is pulled low. Memory element 305 is also programmed, but its wordline is low, so it has no influence on the product term value. Note that because the input value on the cell C2 wordline is true (5V), the value on the compliment wordline is 0V. Finally, the "LAB C3 input" for signal S0 is not programmed. Therefore, it has no influence on the potential of product term bitline 307.

Because product term bitline 307 was pulled low by programmed memory element 303, the output of product term 307 is low or 0V. Note that if there had been no inputs to either cell C0 or cell C1, the output of product term 307 would be high (5V).

Considering now the "output lines" for signal S0, the output of product term 309 will be determined. Note initially that only memory element 311 is programmed. Because its corresponding wordline (the "true" wordline for cell C0) is set at 0V, it does not influence the potential on product term 309. No other cells on product term 309 are programmed. Therefore, the potential remains "high" on the product term (by virtue of the weak pull up described with reference to FIG. 3A).

Now, the outputs of product terms 307 and 309 are passed through NOR gate 351. Because one input is high and the other low, the output of NOR gate 351 is zero. This implies that there are no input interconnects to the logic block under consideration in this partition. This can be understood by recognizing that cell C0 sources the signal and cell C1 receives the signal. Therefore, the input to cell C1 can be made through a local interconnection within the logic block.

Considering now signal S1, product terms 319 and 321 must be evaluated. Note that input product term 319 contains three programmed memory elements (memory elements 313, 315, and 317). These correspond to cells C0, C1, and C3. Because memory elements 313 and 315 are on the compliment wordlines (providing high signals) of their corresponding cells, they each pull down product term 319 to 0 volts. LAB C2 is unprogrammed on product term 319. Therefore, it does not affect the product term potential. Because the inputs associated with the LABs C0 and C1 are low, the output associated with product term 319 is also low. Note that programmed memory element 317 does not affect the product term because its wordline is held low. As cell C3 is not part of the LAB under consideration, this is as it should be.

Now consider the output product term 321, which represents sources of signal S1 in the logic cells in the partition.

It contains no programmed memory elements. Therefore, its output is 0V. This may be understood as follows. When a product term contains no programmed memory elements, it is by default set to a low output. This may be accomplished by programming all of the memory elements of the product term, for example.

The output of NOR gate 353 for signal S1 is high because the two inputs are low. This is not surprising because both cells C0 and C1 require the signal S1 as an input but there are no cells outputting S1 within the current logic block.

Considering now signal S2, an input product term 327 and an output product term 329 must be evaluated. Regarding output product term 329, notice that it has no programmed memory elements. Therefore, its output is 0V. Regarding input product term 327, it has no programmed memory elements associated with LABs C0 or C1. Therefore, the "inputs" for these LABs to product term 327 are high. Product term 327 does include program memory elements 323 and 325 for LABs C2 and C3. As these cells' inputs are set at true (corresponding wordlines for memory elements set low), programmed memory elements 323 and 325 do not affect the potential on product term 327. As a result, all inputs to product term, 327 are high. This means that the output of product term 327 is also high (5V).

As a result, one input to NOR gate 355 is high and the other is low. This means that the output is zero for signal S2. This makes sense when it is realized that neither cell C0 nor cell C1 receive signal S2 as an input.

Next, considering signal S3, product terms 335 and 339 must be considered. Given that memory elements 331 and 333 are programmed on input product term 335, LAB C0 provides an input value of false, LAB C1 provides an input value of false, LAB C2 provides an input value of true, and LAB C3 provides an input value of true. Thus, the input value of LAB C0 to product term 335 is low, and the output of product term 335 is also low (0V). Product term 339 has only one programmed memory element, memory element 337. This is for LAB C3 which provides an input value of true and thus a wordline value of true to memory element 337. Therefore, one of the inputs to product term 339 is false, thereby making the output also false. The output of NOR gate 357 for signal S3 is true, because both inputs are false.

Considering now signal S4, input product term 347 and output product term 349 must be evaluated. Because output product term 349 has no programmed memory elements, its output is 0V. Because memory element 341 is set, LAB C0 puts a 0 value on product term 347. Similarly, because memory element 343 is set, LAB C1 puts a value of 0 on product term 347. Memory element 345 does not affect the potential on product term 347. Thus, the output of product term 347 is zero. Because the outputs of product terms 347 and 349 are both 0, the output of NOR gate 359 is 1. This is understandable because signal S4 feeds cell C0 and C1 and is not output by either on of them.

At this point, the number of input interconnections to the logic block containing cells C0 and C1 can be counted by simply summing the number of 1's output by each of the NOR gates. The outputs for signal S1, S3, and S4, are all 1. The outputs for signals S0 and S2 are 0. Thus, there are three input interconnects required to this logic block.

The same product term array could be used to calculate the number of input interconnects required for a logic block housing cells C2 and C3 (the other logic block of the current partition). This is accomplished by simply setting the input values for LAB C2 and LAB C3 to be false and the input values to LAB C0 and LAB C1 to be true.

First considering signal S0, the input from LAB C2 applies a 0 to product term 307, resulting in an output value of 0V for the product term. The output of product term 309 is also 0V. Therefore, the output of NOR gate 351 is 1. Next, considering signal S1, memory element 317 applies a 0 input signal to input product term 319. Thus, the output of product term 319 is 0V. The output of product term 321 is also 0V. Therefore, the output of NOR gate 353 is 1. Next, considering signal S2, the outputs of product terms of 327 and 329 are both 0. Thus, the output of NOR gate 355 is 1. Cell C3 sources signal S3, while signal S3 feeds cell C2. Therefore, the resulting output value for signal S3 (NOR gate 357) should be 0. That is, no input interconnect is required. This can be understood by recognizing that the output of product term 335 is 0V, while the output value of product term 339 is 5V. Finally, with respect to signal S4, the outputs of both product terms 347 and 349 are 0V. Thus, the output of NOR gate 359 is 1.

From the above, it can be seen that the number of input interconnects to the logic block containing cells C2 and C3 is 4. Thus, the total number of interconnect inputs to the two logic blocks in the above-described partition is 3+4 or 7.

For comparison, a different partition of the same four cells between two different logic blocks will be considered. In this example, cells C0 and C3 are provided in one logic block and cells C1 and C2 are provided in the other logic block. First considering the logic block containing cells C0 and C3, the inputs to the wordlines for those two cells are set false.

With regard to signal S0, the output of product term of 307 is 5V. With respect to product term 309, the output is also 5V. Thus, the total number of input interconnects to the logic block under consideration is 0 (the output of NOR gate 351). Next, considering signal S1, both LAB C0 and LAB C3 place 0V inputs on product term 319. Therefore, the output of product term 319 is also 0V. As there are no connections to product term 321, its output is, as always, 0V. Thus, the output of NOR gate 353 is 1. In other words, a single input interconnect is required to get signal S1 to the logic block under consideration. Next, considering signal S2, the output of product term 327 is 0V (as dictated by LAB C3) and the output of product term 329 is 0V. Thus, the output of NOR gate 355 is 1. Next, considering signal S3, LAB C0 (through memory element 331) sets the output of product term 335 to 0V and LAB C3 does not affect the output of product term 339, so that output remains at 5V. Therefore, the output NOR gate 357 is 0. Finally, considering signal S4, both LAB C0 and LAB C3 put 0V inputs on product term 347. Therefore, the output of product term 347 is 0V. As always, the output of product term 349 is also 0V. Therefore, the output of NOR gate 359 is 1. From the above, it can be seen that input interconnects are required to feed signals S1, S2, and S4 to the logic block housing cells C0 and C3.

It now remains to be determined how many input interconnects are required to feed the logic block containing cells C1 and C2. This is accomplished by setting the input values on LAB C1 and LAB C2 to 0V. The analysis of this logic block configuration will now be described.

Regarding signal S0, both LAB C1 and LAB C2 apply input values of 0V to product term 307. Therefore, the output of product term 307 is 0. The output of product term 309 is also 0. Therefore, the output of NOR gate 351 is 1. Similar analysis shows that for signal S1, the output of NOR gate 353 is 1. For signal S2, the output of NOR gate 355 is also 1. For signal S3, the output of NOR gate 357 is also 1. Finally, for signal S4, the output of NOR gate 359 is again 1. Thus, a separate input interconnect is required for each and every signal (S0–S4) for the logic block containing cells C1 and C2.

In the end, the partition containing logic blocks housing C0 and C3 in one case and C1 and C2 in the other case, requires a grand total of 5+3 or 8 input interconnects. This is one more input interconnect then is required for the other partition in which one logic block contains cells C0 and C1 and the other logic block contains cells C2 and C3. Thus, in the algorithms of this invention, the first partition generally would be deemed better and possible used for further processing.

Note that this was a very simple example employing a partition of four logic cells between two logic blocks. Further, only five signals were considered and each cell output only a few signals. The invention is well suited for much larger problems. Each new cell in the partition adds another wordline input and each new signal adds another pair of product terms.

Many available programmable devices implement product term logic. For example, the MAX 7000 and MAX 9000 available from Altera Corporation of San Jose, Calif. provide product term logic that can be configured to implement a partitioning routine in the manner described above. In addition, some generic RAM memory elements can be configured to act as product terms suitable for use with this invention. For example, a memory block sometimes referred to as an embedded array block ("EAB") used in a non-product term PLD (e.g., one employing look-up tables) may be configured to act as a product term array suitable for use with this invention. Details of this approach are described in U.S. patent application Ser. No. 09/034,050 filed on Mar. 3, 1998 naming F. Heile as inventor and titled "PROGRAMMABLE LOGIC ARRAY DEVICE WITH RANDOM ACCESS MEMORY CONFIGURABLE AS PRODUCT TERMS." That reference is incorporated herein by reference in its entirety and for all purposes. A related document, F. Heile, A. Leaver, and K. Veenstra, "Embedded System Blocks in Programmable Logic Devices," (provided as an appendix to this application) describes configuring embedded array blocks as CAMs. That document is incorporated herein by reference in its entirety and for all purposes.

4. EXAMPLE OF SYSTEM USED TO PARTITION WITH PTERMS

Figure 5:
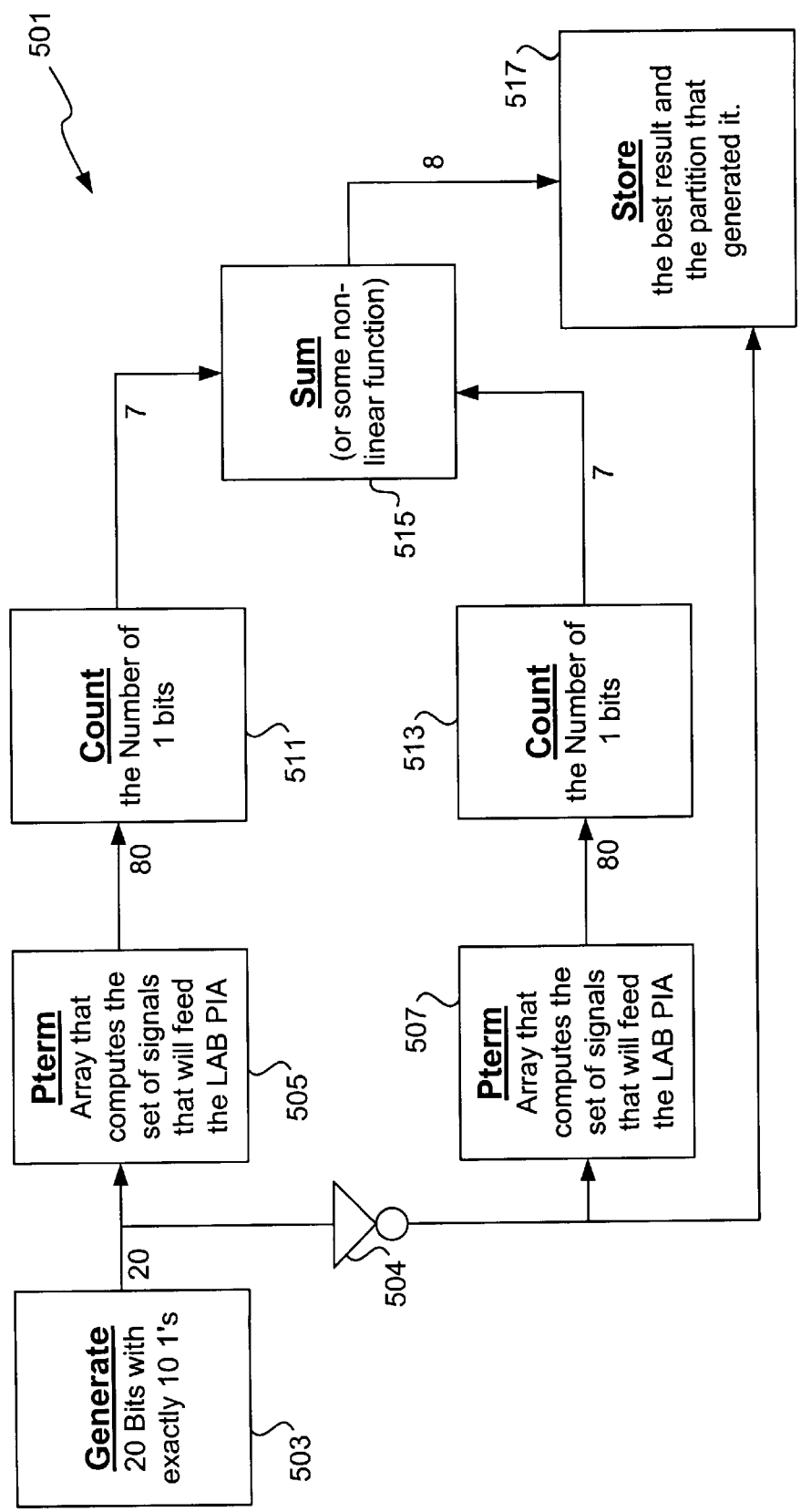
FIG. 5 is a block diagram illustrating the architecture of a partitioning circuit employing two product term arrays to calculate the metric of various partitions of logic cells having a defined collection of signals.

Various approaches may be taken to provide the wordline inputs necessary to define the various partitions that must be compared with a product term array. In one case, the block simply includes a counter which counts from $0-2^{20}$ in twenty bit values (assuming that there are 20 cells that must be partitioned between two logic blocks). Associated with this counter must be logic to identify those values having exactly ten "1s." In a more preferred approach, a "generate block" (described below with reference to FIG. 5) contains the logic to generate all possible partitions of a collection of logic cells between two logic blocks. In the specific case of two logic blocks of ten logic cells each, there are 187,756 such partitions which must be generated if all possible partitions are to be considered. In an alternative embodiment, less than all possible partitions are considered. Preferably, the generate block is part of the same hardware block that includes the product term array and the other components as depicted in FIG. 5.

In a preferred embodiment, one or more ROMs are employed to generate addresses corresponding to all combinations of logic cell partitioning between two logic blocks.

Figure 4B:
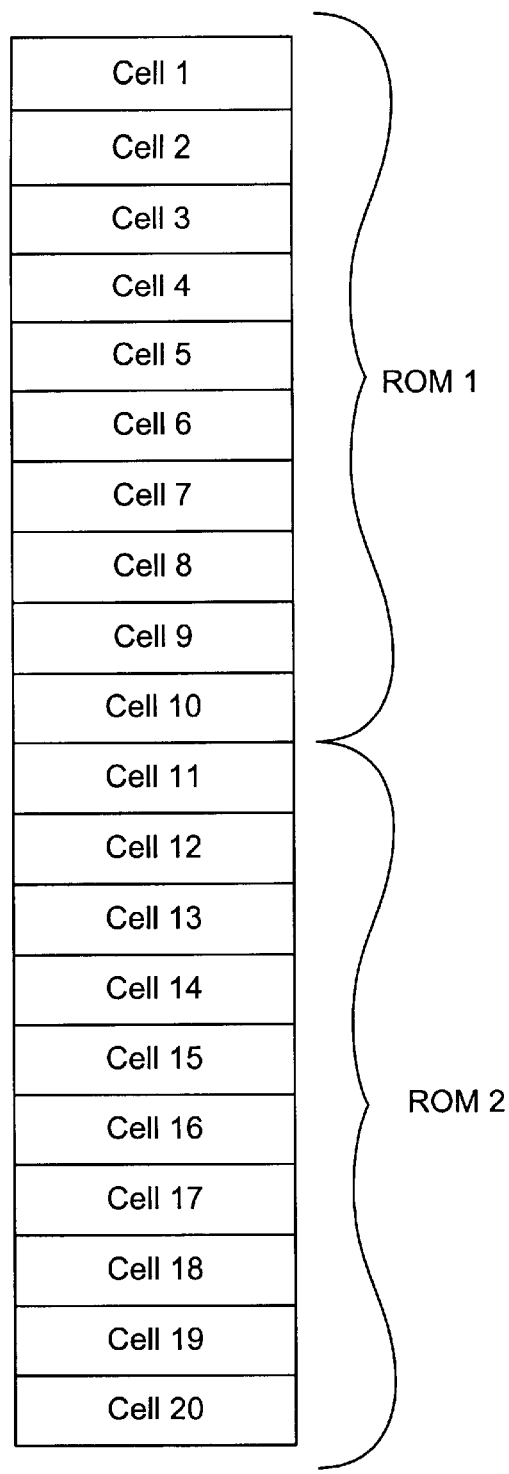
FIG. 4B is a representation of the cells to be partitioned between two logic blocks with the aid of the ROM state machine depicted in FIG. 4A.

FIGS. 4A and 4B show a preferred ROM design for generating all possible partitions of twenty logic cells between two logic blocks of ten cells each. This design could easily be extended to cover other logic block sizes. This design generates all patterns of 20 bits containing exactly 10 bits that are 1. This can be accomplished with two ROMs holding all patterns of 10 bits sorted appropriately together with an eleven state control circuit.

FIG. 4A is state diagram in which ROM values are grouped by the two ROMs and the number of 1 bits in value together with the total number of combinations associated with each of these states. FIG. 4B shows the twenty cells that need to be partitioned into the two logic blocks. It is used to illustrate some of the examples of ROM addresses generated with the aid of the state machine depicted in FIG. 4A.

There are eleven states associated with state machine 402. Each of the two ROMs is populated with 1024 10 bit addresses as will be explained below. The first ROM correspond to cells 1–10 illustrated in the top half of FIG. 4B. The second ROM includes cells 11–20 as illustrated in the bottom half of FIG. 4B. Each 10 bit entry in the first ROM represents each of cells 1–10. When any of these bits is set to 1, the corresponding cell is placed in the logic block under consideration.

Each of the states in the control circuit correspond to the number of 1s in the 10 bit entries of the ROM under consideration. In state 0, there are zero 1s in the entry provided in the first ROM. There are ten 1's in the entry provided in the second ROM. This means that none of cells 1–10 appear in the logic block under consideration. However, each of cells 11–20 do appear in that logic block. This corresponds to one possible partition. In state 1, one of cells 1–10 appears in the logic block under consideration while nine of cells 11–20 appear in that logic block. As indicated in FIG. 4A, there are ten possible combinations meeting this requirement. In ROM 1 that means that a "1" value can appear in any one of the ten positions of a 10 bit entry. Similarly, there are ten entries for state 1 in ROM 2. Each of these entries has a different position for a value of 0.

In state 2, there are forty-five entries in ROM 1 and forty-five entries in ROM 2. Each of these forty-five entries in ROM 1 contain two 1 values and eight 0 values. Each of the forty-five entries in ROM 2 contain eight 1 values and two 0 values. The forty-five entries in ROM 1 correspond to all possible combinations of two 1s in a 10 bit value. The forty-five entries in ROM 2 correspond to all possible combinations of eight 1s in a 10 bit value.

The state machine shows the number of combinations for each of the eleven states. Note that there is a symmetry in which the number of combinations increases from 1–252 going from state 0 to state 5 and then decreases back to one entry in state 11. The total number of entries for all states in ROM 1 is 1024. This means that there are 1024 10 bit entries in ROM 1. Similarly, there are 1024 10 bit entries in ROM 2.

Figure 4C:
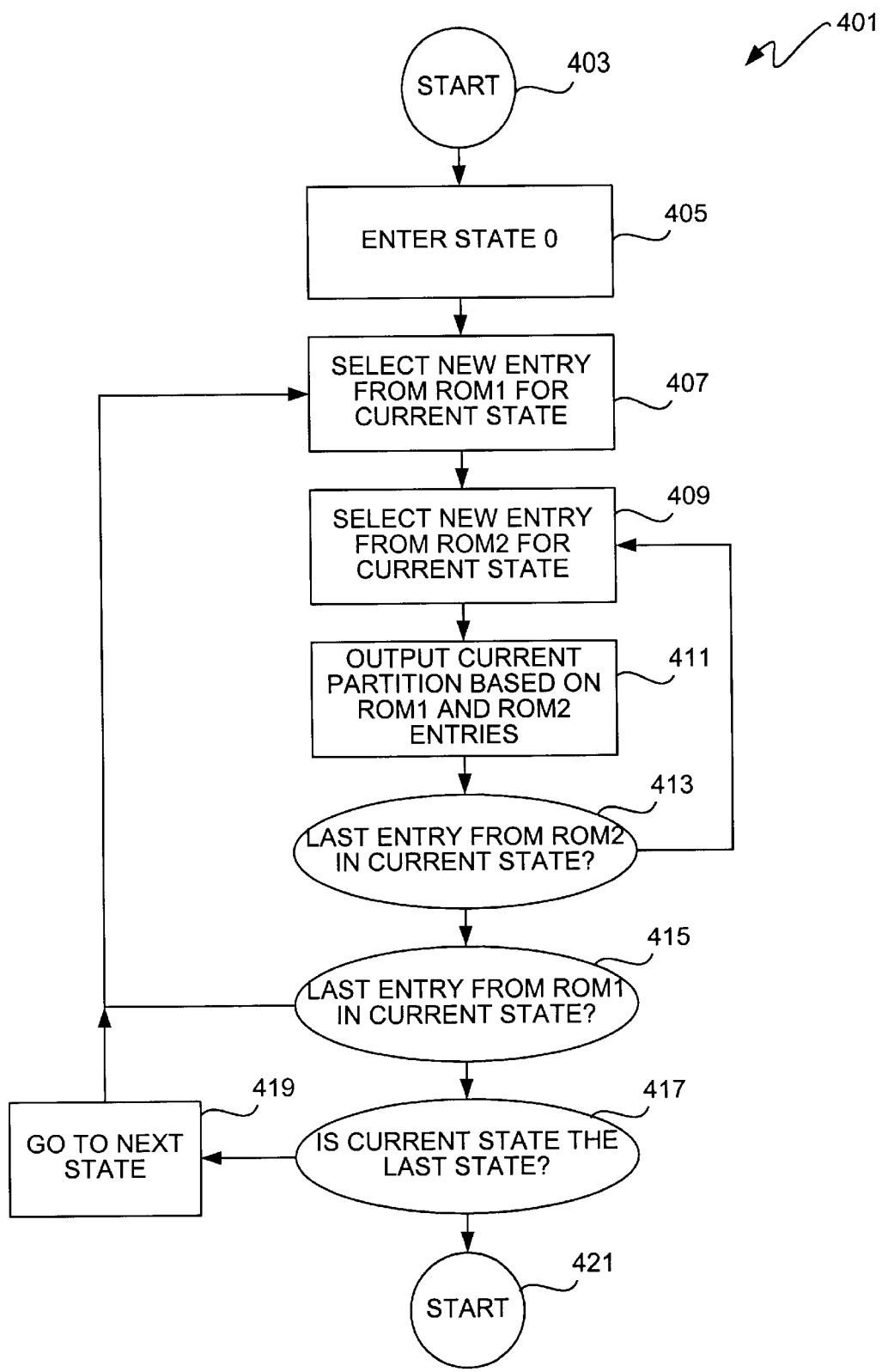
FIG. 4C is a flow chart illustrating the process by which the state circuit of FIG. 4A generates the partitions used by a hardware partitioning device.

The 184,756 possible partitions of 20 cells into 2 logic blocks is obtained from ROMs 1 and 2. A process of generating these partitions from the two ROMs is illustrated in FIG. 4C. As shown there, a process 401 begins at 403 and in a process step 405 the ROM logic enters state 0.

To generate the partitions, the system selects all possible combinations of entries from ROMs 1 and 2 for each state. This technique is illustrated through the remainder of process 401. At a step 407, the system selects a new entry from ROM 1 for the current state. At the beginning of the process, this will be the single entry for state 0 in ROM 1 (a 10 bit value comprised entirely of 0s). Next, at a step 409, the system selects a new entry from ROM 2 for the current state. Again, for state 0, this will be the single entry in ROM 2 (a 10 bit value comprised entirely of 1s).

From the current entries from ROMs 1 and 2 as generated at steps 407 and 409, the system outputs a current partition at a step 411. This current partition will be a 20 bit concatenation of the current values from ROMs 1 and 2. Thus, it will contain ten positions having 1s and ten positions having 0s. The ten 1 positions correspond to cells that comprise the cells grouped in a single logic block.

After the current partition has been output at step 411, the system next determines whether it has considered the last entry from ROM 2 in the current state. See step 413. In the case of states 0 and 10, this question will always be answered in the affirmative because there is only a single entry in these states. In other states, however, this step allows consideration of each of the entries in ROM 2 for a given selection in ROM 1.

Assuming that decision step 413 is answered in the affirmative (the current entry in ROM 2 is in fact the last entry), the system then determines whether the current entry from ROM 1 is the last entry of ROM 1 for the current state at decision step 415. Again, when the system is in state 0 or state 10, this question will always be answered in the affirmative. In other states, this question is answered in the affirmative only after all entries in that state have been considered. Assuming that decision step 415 is answered in the affirmative, the system next determines whether the current state is the last state at a decision step 417. This question will be answered in the negative only once. When that occurs, the last partition has been generated and the process has concluded at 421.

Assuming, however, that the current state is not the last state to be considered, the system increments to the next successive state at a process step 419. From there, process control returns to step 407 where the first entry from ROM 1 for the new current state is selected. The process then continues in the manner described above. As long as there are additional entries to be considered from ROM 2 in the current state, the system loops through steps 409, 411, and 413 to generate all possible entries from ROM 2 for the current state and the current value from ROM 1. And, so long as there are additional entries in ROM 1 for the current state, decision step 415 is answered in the negative. This causes process control to be directed back to step 407 where the next successive entry from ROM 1 is selected. In this manner, all possible partitions of X cells into two logic blocks are generated.

FIG. 5 shows a partitioning circuit that may be implemented in hardware in accordance with one embodiment of this invention. The particular partitioning circuit 501 illustrated in this figure employs product term devices and is designed to handle the 20 cell problem described above.

In circuit 501, a generate block 503 provides the partitions which are evaluated and compared to identify the best partition among all possible partitions of 20 cells. Generate block 503 provides 20 bit values having exactly ten 1s contained therein. These values may be generated by any suitable processes. In a preferred embodiment, they are generated by the two ROM, eleven state system described above. The 20 bit values output by generate block 503 are fed to two product term arrays, a product term array 505 and a product term array 507. In a preferred embodiment, both of these product term arrays are programmed with the same set of memory elements. In other words, both product term arrays use the same "representation" of the interconnection matrix for the twenty logic cells under consideration. One of the product term arrays considers the partition from the perspective of a first logic block and the other product term array considers the partition from the perspective of a second logic block. Because the first and second logic blocks are compliments of one another, the inputs to product term array 507 from generate block 503 are inverted first by an inverter 509. Thus, product term array 505 receives one value of the current partition (a 20 bit value), while product term array 507 receives the compliment of that 20 bit value.

The inputs to product term arrays 505 and 507 (from generate block 503) control the values on the 20 wordlines comprising these product term arrays. As described above, each product term array outputs the number of inputs to the logic block that it is considering. The output of each product term array must be large enough to account for the maximum possible number of input signals going to the two logic blocks under consideration. For example, if there are twenty cells (as in the case illustrated), each having as many as four inputs, then there must be a capacity to handle 80 signals in the product term array output. Thus, the outputs of the product term arrays 505 and 507 are 80 bits wide in this example. There is one bit for each signal in this output. If that bit value is true, that signal feeds the logic block under consideration. Because the product term array contains a representation of the entire interconnection matrix of cells and signals, it can provide its output in a single cycle.

The output of product term array 505 feeds a adder block 511 which counts the number of 1 bits in the 80 bit output signal from the array. This number of bits corresponds to the total number of inputs feeding the product term under consideration. A second adder block 513 counts the number of 1s in the 80 bit output signal from producer term 507. This count represents the number of inputs to the second logic block of the current partition.

The relative "metric" of the current partition may be determined by the total number of inputs to the first and second logic blocks under consideration. This total may be calculated by a "sum" block 515 which receives input values from adder block 511 and adder block 513. These input signals are 7 bit values which specify how many of the eighty possible signals feed the logic block under consideration. Sum block 515 calculates the total number of inputs feeding the blocks of the partition and outputs this as an 8 bit value. A "store" block 517 receives this value along with the identification of the current partition, which its receives from generate block 503. Store block 517 stores the best result obtained so far together with the partition that generated it.

As mentioned, adder blocks 511 and 513 count the total number of 1s in 80 bit outputs from the product term arrays. In a preferred embodiment, these adder blocks are implemented in a tree design which includes a first level of 40 adders each of which sum two of the 80 bits in the input signal. At a next stage in a pipeline of this tree, multiple adders add the outputs of the first stage adders. Obviously, there will be fewer adders in this stage (twenty in a specific embodiment). In addition, the output of the second stage will have to be a larger value than the output of the first stage in order to have enough bits to represent the maximum count. Ultimately, the tree converges to a trunk or root which calculates the total number of input signals feeding the logic block under consideration. This pipelined tree design will include registers between the stages and require a few clock cycles in order to calculate the total number of inputs to the logic block. Other portions of partitioning circuit 501 may have to be pipelined so that the correct values arrive at the correct times to particular blocks in the circuit. For example, a series of registers may be placed on a line 519 connecting generate block 503 to store block 517. This ensures that the value representing the current partition at store block 517 at the same time as the metric representing the sum of the input signals feeding that partition.

Sum block 515 may be a simple adder capable of adding two 7 bit numbers and outputting the result to store block 517. In some embodiments, sum block 515 will simply perform a linear addition of the values from adder blocks 511 and 513. In other embodiments, however, block 515 may perform a non-linear operation. This may be desirable to account for the benefits of evenly distributing the number of inputs between two logic blocks, rather than providing most of the inputs on a single logic block. For example, consider two partitions: one which includes 14 inputs to the first logic block and 14 inputs to the second logic block, and a second partition which includes 22 inputs to the first logic block and only 2 inputs to the second logic block. The first partition has a total of 28 inputs, while the second partition has a total of 24 inputs. A simple linear summation would indicate that the second partition is superior to the first because it has fewer inputs. However, routing 22 inputs to a single logic block could be very difficult in some hardware designs. If this is the case, a non-linear function implemented in block 515 might actually indicate that the first partition is superior because the number of inputs are better balanced between the two logic blocks. For example, a sum of squares function would give a value of 392 for a 14/14 partition and a value of 488 for a 22/2 partition.

Store block 517 provides the best value after all 184,756 partitions have been considered. Specifically, block 517 stores the best partition and a number of inputs feeding it. In a specific embodiment, store block 517 includes a 20 bit register to hold the best partition. It also includes an 8 bit register to hold the best previous metric value (number of inputs feeding the best partition). Block 517 may also include a comparator to compare the best previous metric and the current metric, and store the better of these values.

The various features of a partitioning circuit such as the one depicted in FIG. 5 can be provided in one or more hardware devices. As mentioned, the product term arrays may be implemented on dedicated product term hardware or on a device employing embedded array blocks, for example. The ROMs described above with respect to FIGS. 4A–4C may be implemented on ten embedded array blocks of 2 Kbits each. Each of the product term arrays 505 and 507 could be implemented on five such embedded array blocks to obtain the necessary 80 outputs.

In a particularly preferred embodiment, multiple instances of the partitioning circuit are employed. One or more of them could perform the computations necessary for partitioning a pair or pairs of logic blocks, while one or more others are being programmed to define the interconnection matrix for another pair or pairs of logic blocks. In addition, the logic which normally selects logic block pairs for partitioning can be implemented in hardware—either on the same chip as the partitioning circuit or on another chip.

Figure 6:
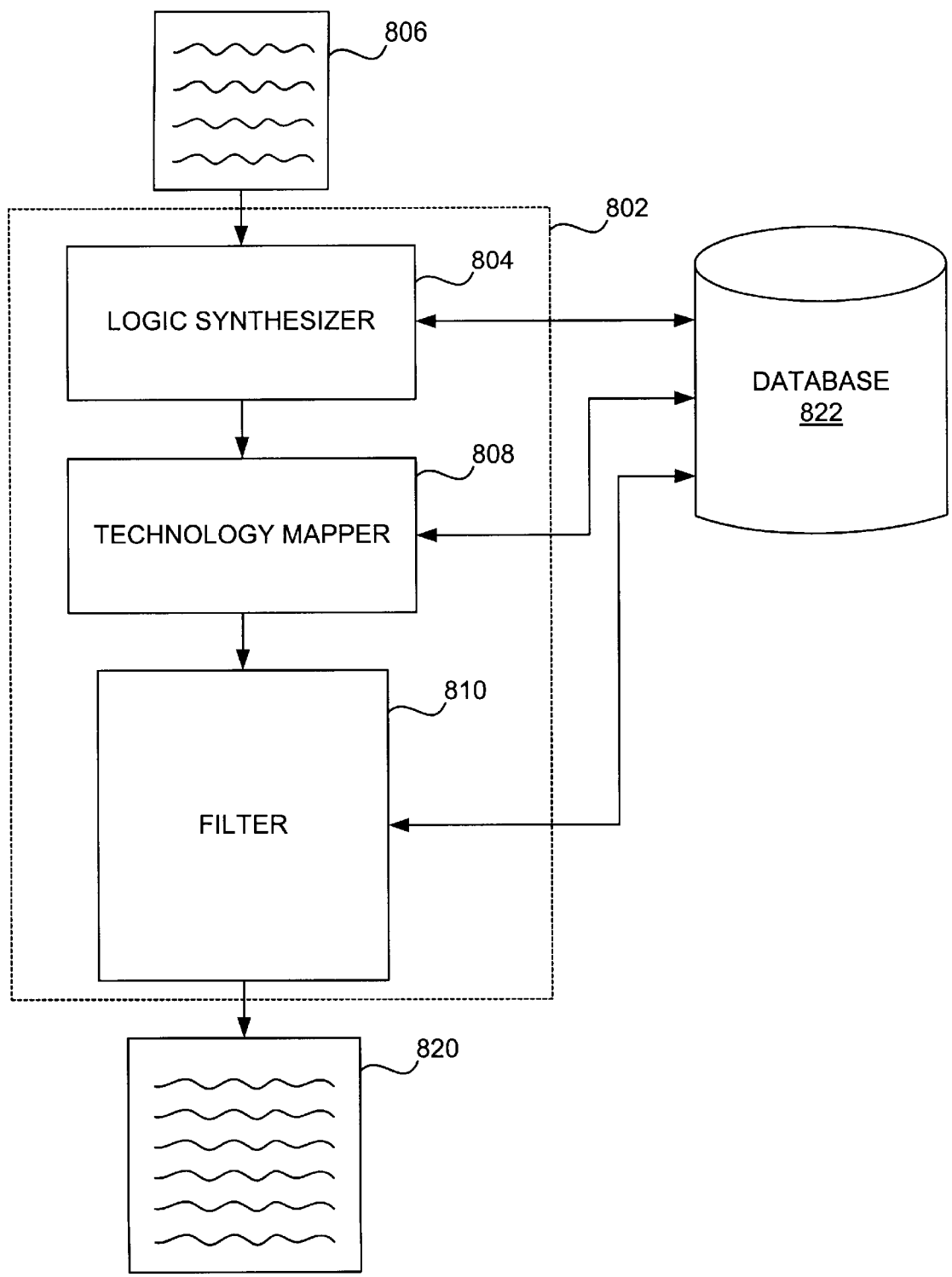
FIG. 6 is a block diagram showing modules that may be employed in a PLD design compiler of this invention.

In a preferred embodiment, the hardware fitting elements of this invention are integrated in a compiler that includes software. Referring to FIG. 6, a compiler 802 suitable for use with this invention includes a logic synthesizer 804 (typically software) which creates a synthesized netlist from a user's high level electronic design 806. Compiler 802 also includes a technology mapper 808 (typically software) which maps gates from the synthesized netlist into logic cells. Compiler 802 includes a fitter module 810 which partitions and places logic cells onto specific logic elements of a target hardware device. It also connects wires between the inputs and outputs of the various logic elements in accordance with the logic required to implement the electronic design. Compiler 802 outputs a compiled design 820. Preferably, at least the partitioning function of fitter 810 is implemented as hardware.

It should be understood that other compiler designs may be employed with this invention. In addition, the compiler may be adapted to handle hierarchical designs, whereby synthesis, mapping, etc. are performed recursively as the compiler moves down branches of a hierarchy tree. Additional details of compiler software for PLDs may be found in U.S. patent application Ser. No. 08/958,670, naming D. Mendel as inventor, and entitled "PARALLEL PROCESSING FOR COMPUTER ASSISTED DESIGN OF ELECTRONIC DEVICES" (previously incorporated by reference).

Generally, the software components of the compiler will form part of an electronic design automation (EDA) system. Note that all components of compiler 802 make use of compiler database 822 which stores the data describing the design in its compiled or partially compiled state.

Figure 7:
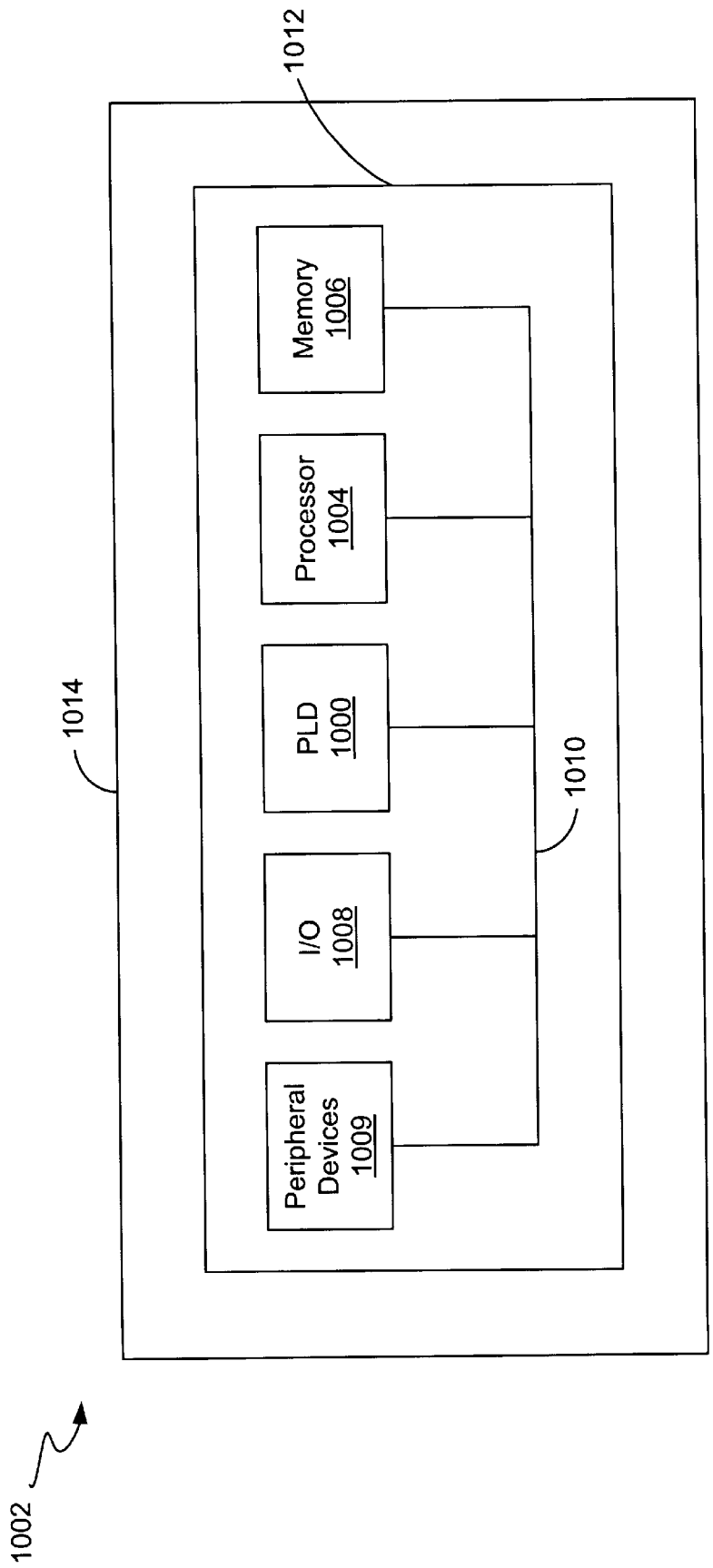
FIG. 7 illustrates a data processing system containing a PLD produced in accordance with this present invention.

This invention also relates to programmable logic devices programmed with a design prepared in accordance with the above described methods. The invention further relates to systems employing such programmable logic devices. FIG. 7 illustrates a PLD 1000 of the present invention in a data processing system 1002. The data processing system 1002 may include one or more of the following components: a processor 1004; memory 1006; I/O circuitry 1008; and peripheral devices 1009. These components are coupled together by a system bus 1010 and are populated on a circuit board 1012 which is contained in an end-user system 1014.

The system 1002 can be used in a wide variety of applications, such as computer networking, data networking, instrumentation, video processing, digital signal processing, or any other application where the advantage of using reprogrammable logic is desirable. The PLD 1000 can be used to perform a variety of different logic functions. For example, PLD 1000 can be configured as a processor or controller that works in cooperation with processor 1004. The PLD 1000 may also be used as an arbiter for arbitrating access to a shared resource in the system 1002. In yet another example, the PLD 1000 can be configured as an interface between the processor 1004 and one of the other components in the system 1002. It should be noted that the system 1002 is only exemplary, and that the true scope and spirit of the invention should be indicated by the following claims.

The foregoing describes the instant invention and its presently preferred embodiments. Numerous modifications and variations in the practice of this invention are expected to occur to those skilled in the art. For instance, the present invention may be implemented on various hardware devices including arrays of Product Terms, Altera 7000S PLDs, and the like. In addition, the technique and system of the present invention is suitable for use with a wide variety of BDA tools and methodologies for programming a device. Therefore, the described embodiments should be taken as illustrative and not restrictive, and the invention should not be limited to the details given herein but should be defined by the following claims and their full scope of equivalents.

What is claimed is:

1. A hardware device comprising a first product term array configured to (a) provide a representation of connections to a plurality of logic cells and (b) output the number of connections to a first logic block containing a first subset of the plurality of logic cells, wherein the number of connections is determined by a first set of input values to the first product term array which first set of input values represent the first subset of logic cells in the first logic block;
   wherein the input values to the product term array are provided through wordlines to the product term array.

2. A method of performing fitting calculations of an electronic design to be fitted onto a substrate, the method comprising:
   configuring hardware specially designed to perform at least a portion of the fitting calculations;
   performing fitting calculations relating to the electronic design compilation, the fitting calculations being implemented on the specially designed hardware; and
   wherein the fitting calculations include performing multiple logic operations which are not implemented using software instructions.

3. The method of claim 2 wherein the hardware includes a plurality of product term devices.

4. The method of claim 3 further comprising providing, via at least one wordline connected to the product term devices, a first set of input values to the product term devices.

5. The method of claim 3 further comprising:
   storing at least one representation of connections to logic cells by programming memory elements on the plurality of product term devices,
   calculating respective metric values of various fitting options for logic cells by controlling values on wordlines connected to the product term devices, and
   determining the best fitting option of the various fitting options.

6. The method of claim 5, wherein the fitting options are partitions of the logic cells into two or more logic blocks.

7. The method of claim 3, wherein the product term devices are arranged in an array on a programmable logic device.

8. The method of claim 7, wherein the product term devices are provided on an appropriately configured embedded array block of the programmable logic device.

9. The method of claim 2, further comprising performing calculations necessary for a compilation function other than fitting with a general purpose processor operating under the control of software.

10. The method of claim 9, wherein the compilation function includes at least one of logic synthesis and technology mapping.

11. A method of performing fitting calculations of an electronic design to be fitted onto a substrate, the method comprising:
    configuring hardware specially designed to perform at least a portion of the fitting calculations; and
    performing fitting calculations relating to the electronic design compilation, the fitting calculations being implemented on the specially designed hardware;
    wherein the hardware includes a plurality of product terms.

12. The method of claim 11 further comprising providing, via at least one wordline connected to the product terms, a first set of input values to the product terms.

13. The method of claim 11 further comprising:
    storing at least one representation of connections to logic cells by programming memory elements on the plurality of product terms,
    calculating respective metric values of various fitting options for logic cells by controlling values on wordlines connected to the product terms, and
    determining the best fitting option of the various fitting options.

14. The method of claim 13, wherein the fitting options are partitions of the logic cells into two or more logic blocks.

15. The method of claim 11, wherein the product terms are arranged in an array on a programmable logic device.

16. The method of claim 15, wherein the product terms are provided on an appropriately configured embedded array block of the programmable logic device.

17. The method of claim 11, further comprising performing calculations necessary for a compilation function other than fitting with a general purpose processor operating under the control of software.

18. The method of claim 17, wherein the compilation function includes at least one of logic synthesis and technology mapping.

19. A method of partitioning a plurality of logic cells between two or more logic blocks, the method comprising:
    configuring a plurality of product terms to provide a representation of connections to the plurality of logic cells;
    setting a first collection of values on a first portion of wordlines connected to the plurality of configured product terms to define a first partition of the logic cells between the two or more logic blocks;
    determining a first number of connections to the logic blocks of the first partition;
    setting a second collection of values on the first portion of wordlines connected to the plurality of configured product terms to define a second partition of the logic cells between the two or more logic blocks;
    determining a second number of connections to the logic blocks of the second partition; and
    determining which partition provides a best fit.

20. The method of claim 19, further comprising setting multiple additional collections of values on the first portion of wordlines connected to define additional possible partitions of the logic cells into a specified number of logic blocks.

21. The method of claim 20, wherein the logic cells are partitioned between two logic blocks.

22. The method of claim 19, wherein setting the first and second collections of values is controlled by data stored in one or more ROMs.

23. The method of claim 22, wherein the data is stored in two ROMs, wherein each ROM includes information relating to a respective half of the logic cells in the plurality of logic cells.

24. The method of claim 19, wherein the determining of the number of connections to the logic blocks of the first partition comprises:
    summing the number of connections for each logic block of the first partition; and
    summing the number of connections summed for each logic block of the first partition.

25. The method of claim 24, wherein the determining of which partition provides the best fit comprises determining which partition has the lowest total number of connections to the logic block.

26. The method of claim 24, wherein the determining of which partition provides the best fit comprises considering a balance of connections between the logic blocks of the partitions.

27. The method of claim 19, wherein configuring a plurality of product terms to provide a representation of connections to the plurality of logic cells comprises programming memory elements at the intersections of the first portion of wordlines and bitlines representing logic cells and signals, respectively.

28. A hardware device for performing fitting calculations of an electronic design, the hardware device comprising:

a first product term array configured to:

provide a representation of connections to a plurality of logic cells; and output the number of connections to a first logic block containing a first subset of the plurality of logic cells;

wherein the number of connections is determined by a first set of input values to the first product term array which first set of input values represent the first subset of logic cells in the first logic block.

29. The hardware device of claim 28 wherein the input values to the product term array are provided through wordlines connected to the product term array.

30. The hardware device of claim 28, further comprising a generation block coupled to the product term array, which generation block defines a plurality of patterns of input values to the product term array, each pattern specifying a partition of the logic cells into the logic blocks.

31. The hardware device of claim 30, wherein the generation block includes a ROM storing multiple values, each corresponding to a partition of the logic cells into the logic blocks.

32. The hardware device of claim 31, wherein the generation block contains two ROMs each of which stores values containing a number of bits equal to one-half the number of logic cells in the plurality of logic cells.

33. The hardware device of claim 32, wherein the outputs of each of the two ROMs defines the first subset of logic cells.

34. The hardware device of claim 28, further comprising an adder block coupled to the product term array, which adder block counts the number of connections output by the product term array.

35. The hardware device of claim 34, wherein the adder block is pipelined.

36. The hardware device of claim 28, further comprising a second product term array configured to (a) provide the representation of connections to the plurality of logic cells and (b) output the number of connections to a second logic block containing a second subset of the plurality of logic cells.

37. The hardware device of claim 36, wherein the second subset of the plurality of logic cells contains no logic cells that are also in the first subset, and wherein a second set of input values is provided to the second product term, which second set of input values is the complement of the first set of input values.

38. The hardware device of claim 37, wherein each of the first and second product term arrays have outputs coupled to adder blocks, which adder blocks count the numbers of connections output by the product term arrays.

39. The hardware device of claim 38, further comprising a summing unit coupled to both the adder blocks, which summing unit sums the number of connections output by the adder blocks to provide a total number of connections to the first and second logic blocks.

40. The hardware device of claim 39, further comprising a storage unit which stores information about the best of a plurality of partitions of the logic cells between the first and second logic blocks.

41. The hardware device of claim 40, further comprising a generation block which defines a plurality of patterns of input values to each of the first and second product term arrays, wherein each pattern specifies a partition of the plurality of logic cells between the first and second logic blocks.

42. The hardware device of claim 39, wherein the device is pipelined.

* * * * *